(12) United States Patent
Khatri et al.

(10) Patent No.: US 9,373,362 B2
(45) Date of Patent: Jun. 21, 2016

(54) SYSTEM AND METHOD FOR IMPLEMENTING A MEMORY DEFECT MAP

(75) Inventors: Mukund P. Khatri, Austin, TX (US); Jimmy D. Pike, Georgetown, TX (US); Forrest E. Norrod, Austin, TX (US); Barry S. Travis, Round Rock, TX (US)

(73) Assignee: DELL PRODUCTS L.P., Round Rock, TX (US)

( * ) Notice: Subject to any disclaimer, the term of this patent is extended or adjusted under 35 U.S.C. 154(b) by 713 days.

(21) Appl. No.: 11/838,593

(22) Filed: Aug. 14, 2007

(65) Prior Publication Data
US 2009/0049257 A1    Feb. 19, 2009

(51) Int. Cl.
| | | |
|---|---|---|
| G06F 12/00 | (2006.01) | |
| G11C 5/04 | (2006.01) | |
| G11C 29/00 | (2006.01) | |
| G11C 29/04 | (2006.01) | |
| G11C 29/56 | (2006.01) | |

(52) U.S. Cl.
CPC ............... *G11C 5/04* (2013.01); *G11C 29/808* (2013.01); *G11C 2029/0407* (2013.01); *G11C 2029/0409* (2013.01); *G11C 2029/5606* (2013.01)

(58) Field of Classification Search
USPC ......................................................... 711/154
See application file for complete search history.

(56) References Cited

U.S. PATENT DOCUMENTS

| | | | |
|---|---|---|---|
| 4,209,846 A | 6/1980 | Seppa | |
| 4,240,143 A | 12/1980 | Besemer et al. | |
| 4,426,688 A * | 1/1984 | Moxley | 365/200 |
| 4,479,214 A | 10/1984 | Ryan | |
| 5,450,576 A | 9/1995 | Kennedy | |
| 5,539,697 A | 7/1996 | Kim et al. | |
| 5,588,112 A | 12/1996 | Dearth et al. | |
| 5,666,482 A | 9/1997 | McClure | |
| 5,671,229 A * | 9/1997 | Harari et al. | 714/710 |
| 5,751,641 A | 5/1998 | Petrosino | |
| 5,758,056 A | 5/1998 | Barr | |
| 5,764,878 A | 6/1998 | Kablanian et al. | |
| 5,774,647 A | 6/1998 | Raynham et al. | |

(Continued)

FOREIGN PATENT DOCUMENTS

| | | |
|---|---|---|
| EP | 0704854 A1 | 4/1996 |
| JP | 2005-234744 A | 9/2005 |

(Continued)

OTHER PUBLICATIONS

Supplementary European Search Report for EP 08 01 4498, dated Mar. 2, 2009.

(Continued)

*Primary Examiner* — Jared Rutz
*Assistant Examiner* — Hamdy S Ahmed
(74) *Attorney, Agent, or Firm* — Baker Botts L.L.P.

(57) ABSTRACT

In accordance with the present disclosure, a system and method are herein disclosed for managing memory defects in an information handling system. In an information handling system, a first quantity of memory, such as RAM, may contain defective memory elements. A second quantity of memory is physically coupled to the first quantity of memory and is used to store a memory defect map containing information regarding the location of defective memory elements in the first quantity of memory. The memory defect map may then be referenced by the BIOS or the operating system to preclude use of regions of memory containing defective memory elements.

19 Claims, 6 Drawing Sheets

(56) References Cited

U.S. PATENT DOCUMENTS

| | | | |
|---|---|---|---|
| 5,862,314 | A | 1/1999 | Jeddeloh |
| 5,867,702 | A | 2/1999 | Lee |
| 5,905,858 | A * | 5/1999 | Jeddeloh .................. 714/52 |
| 5,986,950 | A * | 11/1999 | Joseph .................. 365/200 |
| 5,996,096 | A * | 11/1999 | Dell et al. .................. 714/710 |
| 6,035,432 | A | 3/2000 | Jeddeloh |
| 6,052,798 | A | 4/2000 | Jeddeloh |
| 6,125,392 | A | 9/2000 | Labatte et al. |
| 6,154,851 | A | 11/2000 | Sher et al. |
| 6,158,025 | A | 12/2000 | Brisse et al. |
| 6,173,382 | B1 | 1/2001 | Dell et al. |
| 6,237,110 | B1 | 5/2001 | Lin et al. |
| 6,260,127 | B1 | 7/2001 | Olarig et al. |
| 6,285,607 | B1 * | 9/2001 | Sinclair .................. 365/200 |
| 6,304,989 | B1 | 10/2001 | Kraus et al. |
| 6,324,657 | B1 | 11/2001 | Fister et al. |
| 6,460,152 | B1 | 10/2002 | Demidov et al. |
| 6,499,117 | B1 | 12/2002 | Tanaka |
| 6,499,120 | B1 | 12/2002 | Sommer |
| 6,536,005 | B1 | 3/2003 | Augarten |
| 6,600,614 | B2 | 7/2003 | Lenny et al. |
| 6,601,183 | B1 | 7/2003 | Larson et al. |
| 6,622,269 | B1 | 9/2003 | Ngo et al. |
| 6,728,907 | B1 | 4/2004 | Wang et al. |
| 6,820,224 | B1 | 11/2004 | Lin et al. |
| 6,889,305 | B2 | 5/2005 | Adelmann |
| 7,065,630 | B1 | 6/2006 | Ledebohm et al. |
| 7,114,024 | B2 | 9/2006 | Herbst |
| 7,120,777 | B2 | 10/2006 | Adelmann |
| 7,123,051 | B1 | 10/2006 | Lee et al. |
| 7,246,269 | B1 | 7/2007 | Hamilton |
| 7,251,744 | B1 | 7/2007 | Housty |
| 7,269,765 | B1 | 9/2007 | Charlton et al. |
| 7,272,758 | B2 | 9/2007 | Roohparvar |
| 7,346,755 | B2 | 3/2008 | Pomaranski et al. |
| 7,444,564 | B2 | 10/2008 | Anand et al. |
| 7,447,955 | B2 | 11/2008 | Niijima et al. |
| 7,603,595 | B2 | 10/2009 | Sasaki |
| 2001/0042225 | A1 | 11/2001 | Cepulis et al. |
| 2002/0073353 | A1 | 6/2002 | Fish et al. |
| 2002/0108072 | A1 * | 8/2002 | Beng Sim et al. .................. 714/5 |
| 2002/0120826 | A1 | 8/2002 | Venkatraman et al. |
| 2002/0157048 | A1 | 10/2002 | Roohparvar |
| 2002/0184445 | A1 | 12/2002 | Cherabuddi |
| 2003/0005367 | A1 | 1/2003 | Lam |
| 2003/0058711 | A1 | 3/2003 | Benedix et al. |
| 2003/0072204 | A1 * | 4/2003 | Shiga et al. .................. 365/201 |
| 2003/0095455 | A1 | 5/2003 | Dono et al. |
| 2003/0145250 | A1 | 7/2003 | Chin |
| 2003/0208654 | A1 | 11/2003 | Krontz et al. |
| 2004/0034825 | A1 | 2/2004 | Jeddeloh |
| 2004/0042293 | A1 | 3/2004 | Ogino |
| 2004/0088614 | A1 | 5/2004 | Wu |
| 2006/0004942 | A1 | 1/2006 | Hetherington et al. |
| 2006/0059383 | A1 | 3/2006 | Roohparvar |
| 2006/0236165 | A1 | 10/2006 | Cepulis et al. |
| 2007/0061637 | A1 | 3/2007 | Ward et al. |
| 2007/0101238 | A1 | 5/2007 | Resnick et al. |
| 2007/0136385 | A1 | 6/2007 | Abrashkevich et al. |
| 2007/0174718 | A1 * | 7/2007 | Fouquet-Lapar .................. 714/42 |
| 2007/0217559 | A1 | 9/2007 | Stott et al. |
| 2008/0229143 | A1 | 9/2008 | Muraki |

FOREIGN PATENT DOCUMENTS

| | | |
|---|---|---|
| WO | WO98/02816 | 1/1998 |
| WO | 9905599 A1 | 2/1999 |
| WO | WO99/05599 | 4/1999 |
| WO | 9950748 A1 | 10/1999 |

OTHER PUBLICATIONS

USPTO Non-Final Rejection for U.S. Appl. No. 11/838,687, dated Mar. 10, 2009.

Supplementary European Search Report for EP 08 01 4500, dated Mar. 2, 2009.

Singapore Office Action for Application No. 200805816-6, dated Mar. 30, 2009.

Office Action for European Application No. 08 014 498.3, dated May 13, 2009.

International Search Report and Written Opinion for Singapore Patent Application No. 200805821-6, dated May 4, 2009.

International Search Report and Written Opinion for Singapore Patent Application No. 200805817-4, dated May 28, 2009.

Partial European Search Report for EP 08 014 502.2, dated Aug. 11, 2009.

USPTO Non-Final Rejection for U.S. Appl. No. 11/838,602 dated Mar. 2, 2010.

USPTO Final Rejection for U.S. Appl. No. 11/838,687, dated May 6, 2009.

USPTO Non-Final Rejection for U.S. Appl. No. 11/838,585, dated Nov. 19, 2009.

* cited by examiner

SYSTEM AND METHOD FOR IMPLEMENTING A MEMORY DEFECT MAP

TECHNICAL FIELD

The present disclosure relates generally to computing systems and information handling systems, and, more particularly, to a system and method for creating a map of memory which governs its use by the computing system or information handling system.

BACKGROUND

As the value and use of information continues to increase, individuals and businesses seek additional ways to process and store information. One option available to these users is an information handling system. An information handling system generally processes, compiles, stores, and/or communicates information or data for business, personal, or other purposes thereby allowing users to take advantage of the value of the information. Because technology and information handling needs and requirements vary between different users or applications, information handling systems may vary with respect to the type of information handled; the methods for handling the information; the methods for processing, storing or communicating the information; the amount of information processed, stored, or communicated; and the speed and efficiency with which the information is processed, stored, or communicated. The variations in information handling systems allow for information handling systems to be general or configured for a specific user or specific use such as financial transaction processing, airline reservations, enterprise data storage, or global communications. In addition, information handling systems may include or comprise a variety of hardware and software components that may be configured to process, store, and communicate information and may include one or more computer systems, data storage systems, and networking systems.

An information handling system will typically include some type of temporary information storage medium, such as random access memory. The amount of memory included in an information handling system may be on the order of gigabytes. As memory size increases, the likelihood that part of the memory will either be manufactured defective or become defective over time increases. If left unmanaged, the presence of defective memory cells, regardless of their size, can cause the information handling system to fail. Such failure can initiate an abrupt end to the current operation of the information handling system, resulting in the loss of critical data. A memory failure could also prevent the information handling system from starting up altogether.

As information handling systems continue to evolve and computer technology advances, the operational relationship between the CPU and memory becomes more significant and complex. Many attributes of modem systems (specifically, the introduction of multi-core processors and virtualization) are contributing to an ever-larger memory footprint within a typical information handling system. Consequently, not only is system memory becoming a much more substantial percentage of the overall cost of the information handling solution, the impact of erroneous behavior in the memory can have a much more adverse effect on the life cycle expense associated with the information handling system.

SUMMARY

In accordance with the present disclosure, a system and method are herein disclosed for managing memory defects in an information handling system. In an information handling system, a first quantity of memory, such as RAM, may contain defective memory elements. A second quantity of memory, such as EEPROM, is physically coupled to the first quantity of memory and is used to store a memory defect map containing information regarding the location of defective memory elements in the first quantity of memory. The memory defect map may then be referenced by the BIOS or the operating system to preclude use of regions of memory containing defective memory elements.

The system and method disclosed herein are technically advantageous because a mechanism is provided for reducing the functional and financial impact of defective memory elements. In particular, the present disclosure provides a way for an information handling system to operate normally, despite the presence of one or more defective memory elements, with minimal impact on system performance. By effectively hiding defective memory blocks from the operating system, crashes of the information handling system are better avoided. In addition, by sequestering defective memory elements, the present disclosure extends the life of memory. Overall system costs for the information handling system are correspondingly reduced as memory need not be replaced even after multiple memory elements are found to be defective. Other technical advantages will be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

Figure 1:
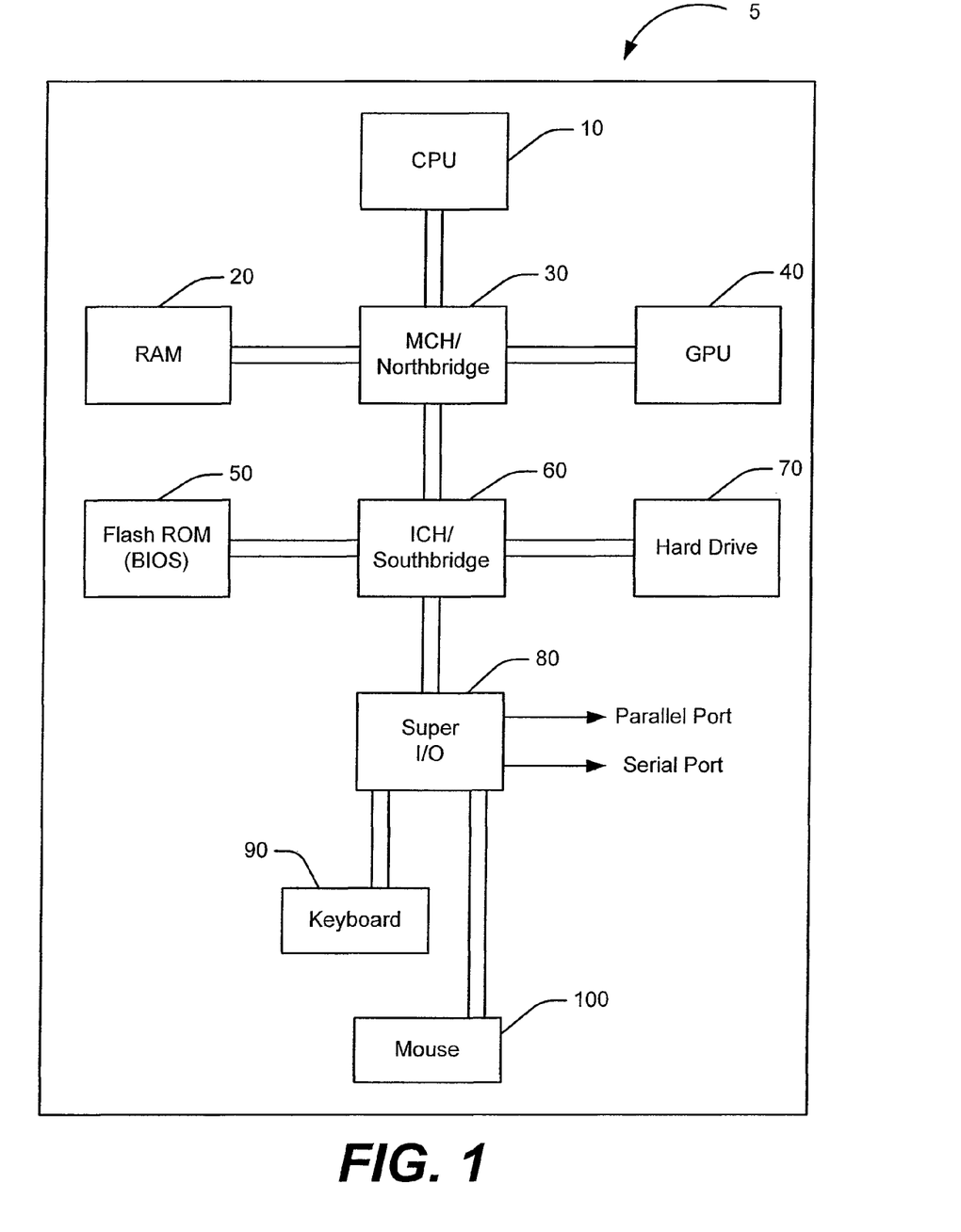
FIG. 1 is a block diagram of a typical information handling system.

Shown in FIG. 1 is a block diagram of a typical information handling system. A processor or CPU 12 of the typical information handling system 10 is communicatively coupled to a memory controller hub or north bridge 30. Memory controller hub 30 is coupled to RAM 20 and a graphics processing unit 40. Memory controller hub 30 is also coupled to an I/O controller hub or south bridge 60. I/O hub 60 is coupled to storage elements of the computer system, including a storage element 50, which may comprise a flash ROM that includes the BIOS of the computer system. I/O hub 60 is also coupled to the hard drive 70 of the computer system. I/O hub 60 may also be coupled to a Super I/O chip 80, which is itself coupled to several of the I/O ports of the computer system, including keyboard 90, mouse 100, and one or more parallel ports.

The system and method described herein involve the management of the memory resources of an information handling system. The system and method involve the use of storage included within memory devices to identify which, if any, of the physical memory of the memory device is unusable by the system. If physical memory is identified as being unusable by the system, the physical memory is logically mapped out of a resulting memory map of the usable computer system, resulting in a memory map of usable memory that does not include the defective physical memory of the memory device.

Figure 2A:
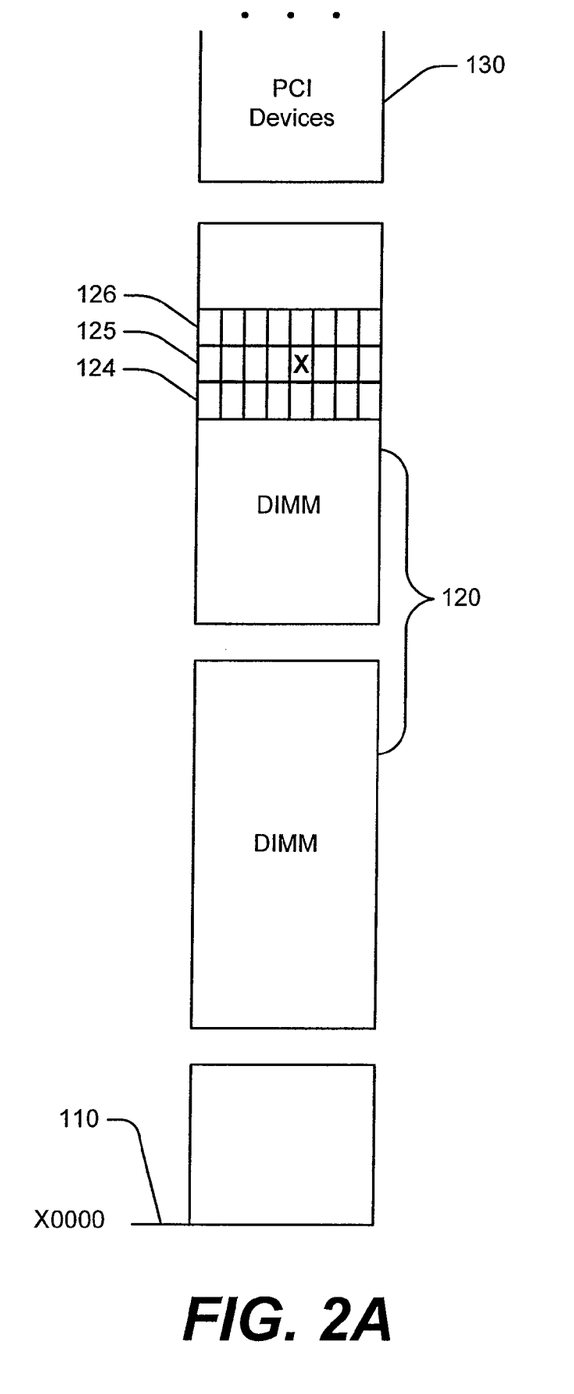
FIG. 2A shows the addressable memory space for a typical information handling system.

At initialization, the information handling system will create a map of the memory or RAM of the system. FIG. 2A is a diagram of the memory space that is reviewed by a memory mapping call, such as an E820 call, within the information handling system. The information handling system 10 may be comprised of numerous distinct components capable of being addressed as memory, including dual-inline memory modules (DIMMs) 120 and PCI devices 130, such as discrete graphics cards. Devices that include addressable memory are detected during the BIOS initialization period, and the memory within these devices is mapped and identified as system-accessible memory during the memory mapping call. A memory mapping call results in the iterative interrogation of possible memory locations, beginning with memory having the lowest possible address within the system 110. The memory mapping call reviews all addressable memory locations, including memory blocks 124, 125 and 126, even though memory block 125 contains a memory defect. As system-accessible memory is located, including DIMMs 120, a map is created of usable, non-defective memory.

Figure 2B:
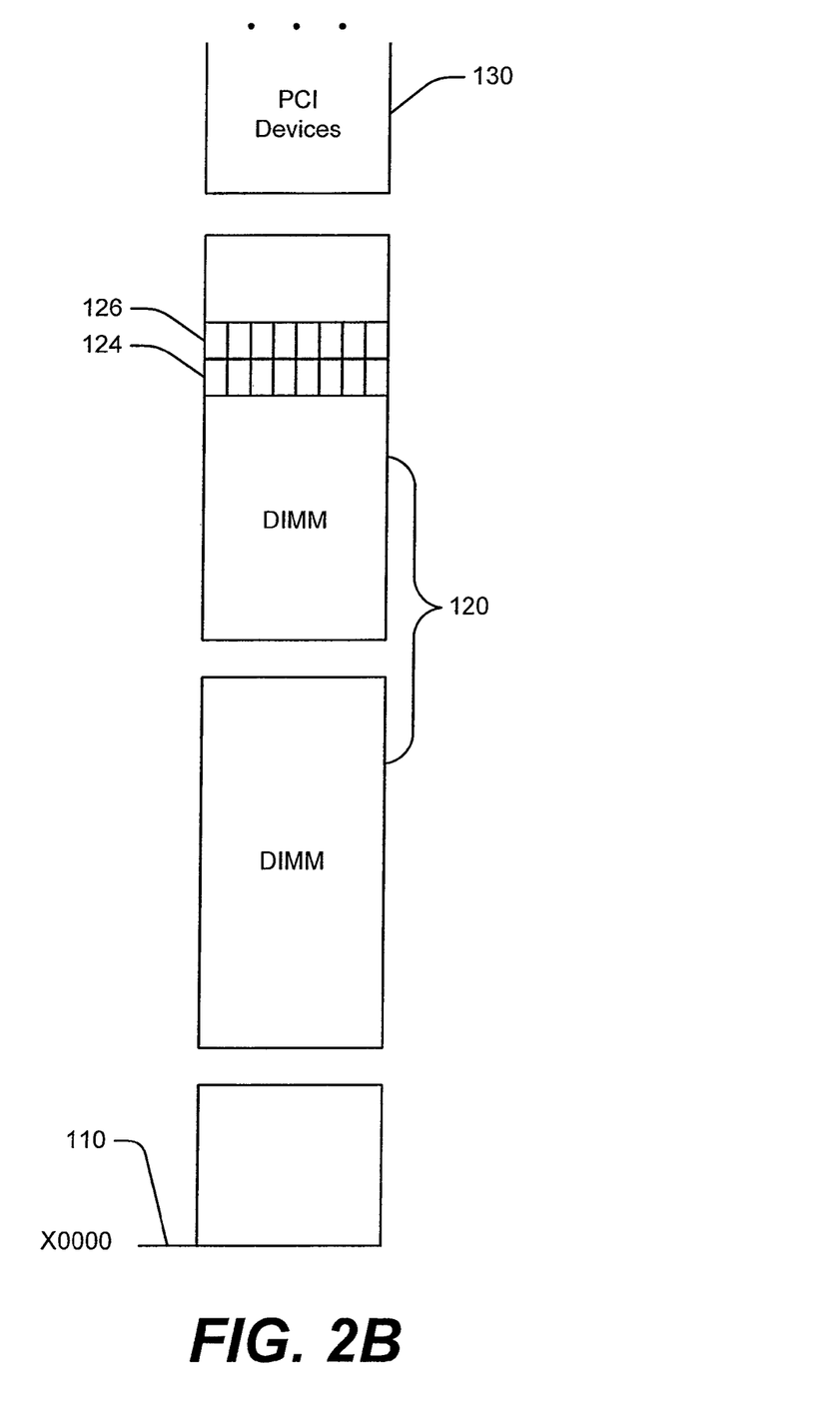
FIG. 2B shows the memory space included in a usable memory map which excludes defect blocks.

As the usable memory map is created, portions of physical memory that are determined to be unavailable or unusable are excluded from the map, resulting in the creation of a logical map that only includes usable and non-defective memory locations. FIG. 2B is a diagram of a usable memory map in which the unusable locations in the memory of the computer system have been logically mapped out of the computer system. For example, memory blocks 124 and 126 are included in the usable memory map, but memory block 125, which contains a defective memory element, is not.

The usable memory map is acquired by the operating system, either as a result of a set of iterative memory mapping calls by the operating system or as a result of a memory mapping function in which the BIOS transmits the completed map to the operating system. Because the map excludes from its scope those physical memory locations that are determined to be unavailable or defective, the operating system is only able to access the memory that is mapped as being usable. Physical memory that is mapped as being unusable cannot be used by the operating system and can therefore be described as being not visible by the operating system.

During the creation of the usable memory map, information regarding the location of usable memory regions is sent to the operating system. This information may take the form of a starting address, the size of the memory block in question, and the type of memory at that location. As defective memory blocks are carved or mapped out of the memory map, the memory map is divided into more pieces and the number of discrete entries that are required to describe the memory available (or unavailable) to the system increases, requiring additional storage and resulting in the fragmentation of memory. A number of strategies can be employed to reduce the administrative burden of identifying an excessive number of defective entries and usable entries.

Figure 3A:
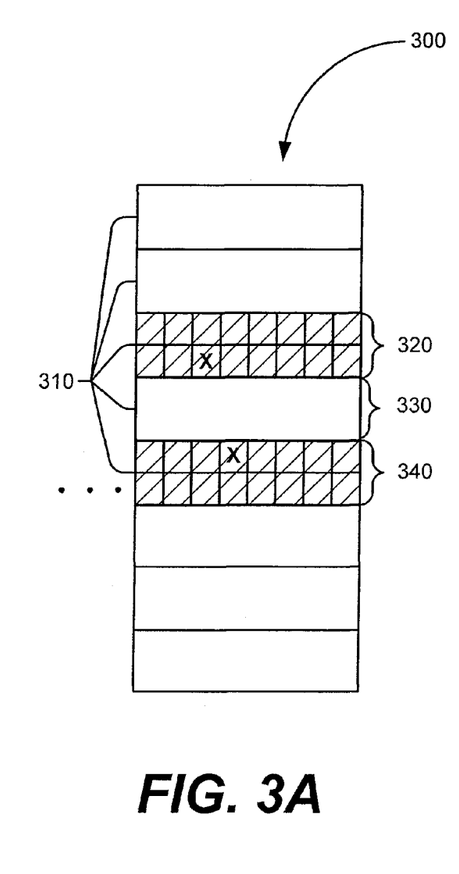
FIGS. 3A and 3B depict the results of reducing fragmentation in a usable memory map.
Figure 3B:
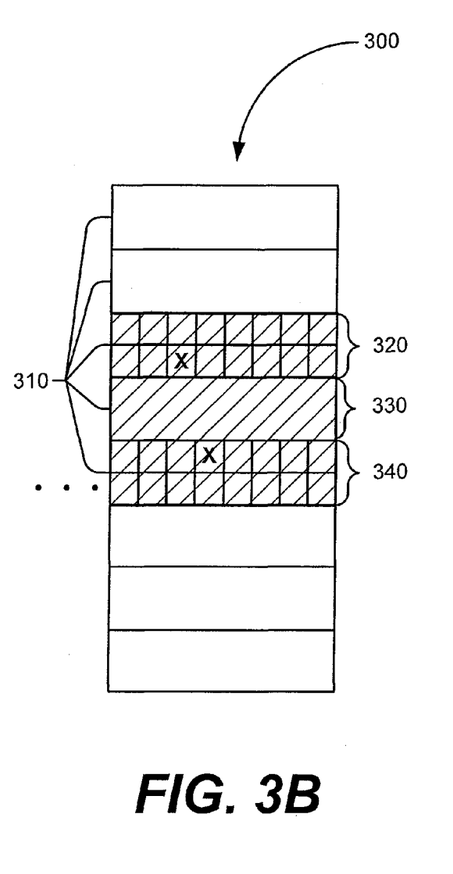

One strategy for reducing the administrative burden of identifying an excessive number of defective entries and usable entries involves grouping proximate defective memory cells into a common defective entry. FIGS. 3A and 3B illustrate DIMMs 300 divided into memory blocks 310. A memory block is a defined section of contiguous storage within a memory device. Included within DIMMs 300 are defect blocks 320 and 340. A defect block is a memory block that includes at least some defective memory within the block. A defect block may include a mixture of defective memory and non-defective or usable memory. If defect blocks 320 and 340 were individually mapped out of the usable memory map, each block would be identified by a starting address and an ending address. Such fragmentation may be ameliorated by detecting the presence of small blocks of usable memory between defective memory blocks and grouping the small usable memory block together with the adjacent defective memory blocks and designating the entire group as unusable. This excludes additional non-defective memory from use by the information handling system, but it reduces the number of addresses that must be stored as part of the usable memory map.

As shown in FIG. 3B, defect blocks 320 and 340 can be grouped into one larger defect block which includes non-defective memory block 330. Since only a single defect block is identified to the operating system, a single usable memory map entry is sufficient to map out both memory defects. To accomplish this reduction in fragmentation, the memory defect map is searched for defect blocks within some specified number of memory blocks from each other. When two such blocks are found, any intervening blocks are marked as defective. This information is subsequently stored in the memory defect map. When the information handling system is next initialized, the usable memory map will include only one entry for the contiguous memory blocks marked as defective, including the intervening non-defective memory block.

Figure 4:
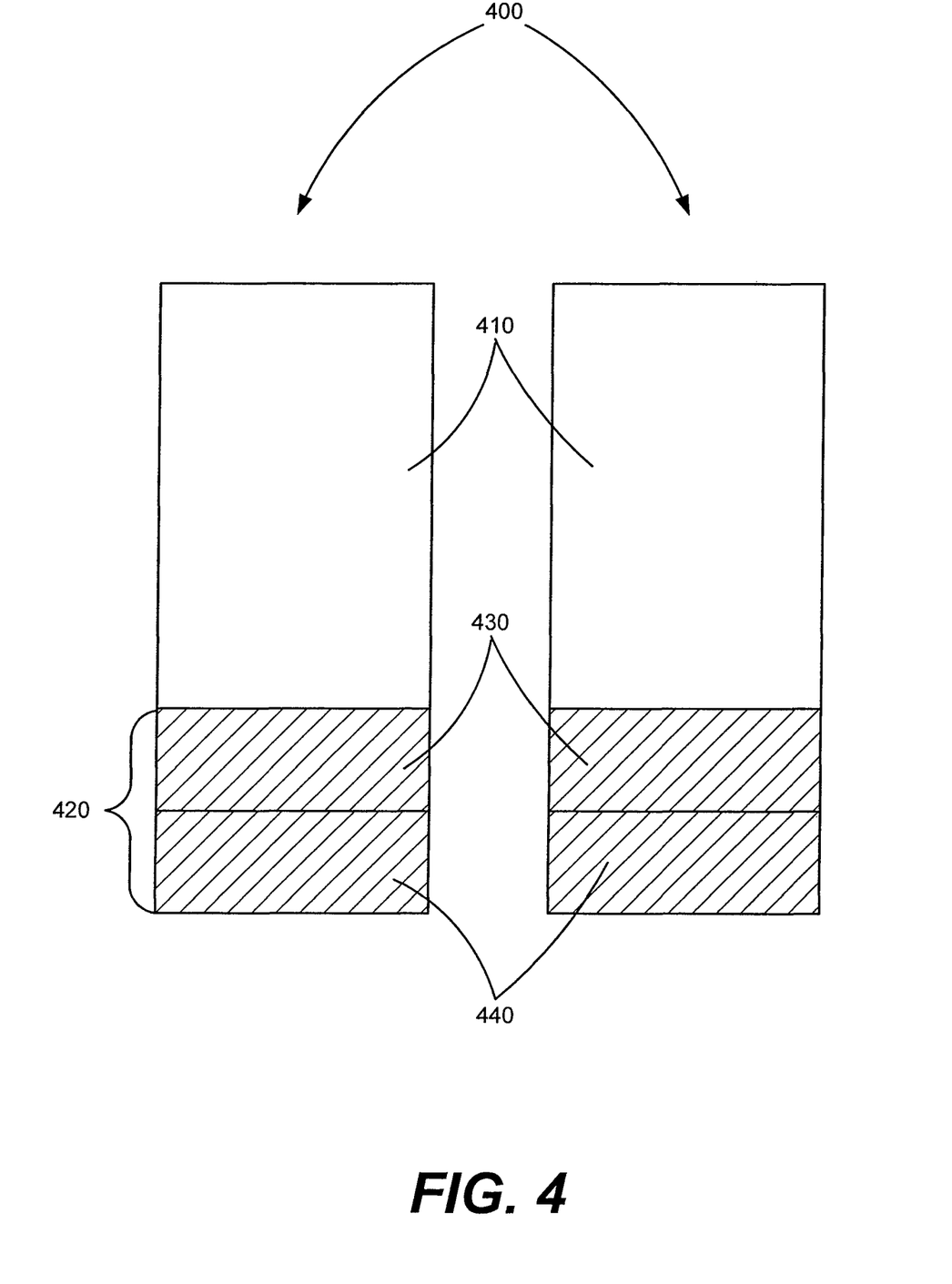
FIG. 4 is a block diagram of two dual-inline memory modules.

FIG. 4 presents a block diagram of memory elements within DIMMs 400. A DIMM may include both RAM 410 and a quantity of electrically-erasable programmable read-only memory (EEPROM) 420, which comprises non-volatile storage that is included on DIMM 400. EEPROM 420 can store serial presence detect (SPD) information, which is data that describes the size, speed, electrical requirements, and other information about the RAM 410. Although the standards of the JEDEC Solid State Technology Association specify that the lower 128 bytes 430 of the EEPROM are reserved for SPD information, DIMMs typically include an additional instance of nonvolatile memory 440 that is not dedicated to SPD information and is referred to herein as memory defect storage 440.

Memory defect storage 440 of EEPROM 420 is used to store information describing the location of defective memory in RAM 410. When a memory cell is identified as defective or if it is otherwise determined that the system should not be granted access to that cell, a block of memory containing the memory cell in question is identified and the location of that memory is stored in memory defect storage 440. The placement of the defect memory storage in a DIMM has advantages in that the memory location within the DIMM is widely implemented in information handling systems and is available for the storage of this information. Moreover, the placement of the memory defect map within the DIMM itself is advantageous, as the memory defect information remains with the DIMM and allows the defect information for the DIMM to travel with the DIMM in the event that the DIMM moves from one computer system to another. Although memory defect storage 440 serves a dedicated location for the identification of defective memory locations, it is not necessary that the defect map be stored in a nonvolatile location within EEPROM 420. Rather, any form of non-volatile storage that is accessible by the computer system could be used to store the record of defective memory locations.

The content of the memory defect storage location is a memory defect map, with each entry in the map corresponding to a region of the physical address on the associated DIMM 400. The size of each designated region in the map is defined by the memory capacity of the DIMM amortized across the number of entries permitted in the map. The size of memory block designated as defective is thus equal to the DIMM capacity divided by the number of bits in the defect map. The larger the available space for the memory defect map, the smaller the size of the memory block that can be designated as defective.

In one embodiment, each bit in the memory defect map in memory defect storage corresponds to one memory block in the DIMM. The size of the memory defect map can be adjusted as appropriate either to minimize the size of the memory map or to maximize the resolution of the memory map, which results in more usable memory. If storage space for the memory map is at a premium, the size of the map can be reduced by simply associating each bit in the memory map with a larger memory block in the RAM of the DIMM. If the maximization of usable memory is a more important consideration, the resolution and size of the memory map may be increased, resulting in finer granularity in identifying the defective memory cells, thereby resulting in fewer usable memory cells being grouped with the defective cell in each memory block and designated unusable as a result. The grouping of memory cells that are designated as being unusable, including defective memory cells and usable memory cells grouped with the defective memory cells, is known as the defect block. As an example, in a system that includes 4 GB of RAM and the defect memory map is constrained to be 80 bytes (640 bits) in size, each time a defective memory cell is detected, 6.4 MB (4 GB/80 bytes) of memory is blocked out as unusable, even if only one cell is identified as being defective. Thus, increasing the size of the defect memory map may result in fewer usable memory cells being grouped with the defective memory cell and being designated as unusable.

In another embodiment, the defect map may be implemented with one byte per entry. This increases the size of the map considerably, but results in much less wasted memory for each defective cell. The defect map is initially indexed such that each entry in the defect map corresponds to one region of memory on the DIMM. Each entry in the defect map is eight bits in length. One bit of each eight-bit entry flags the region as one containing a defective bit. The remaining seven bits of each entry are used as an address for one or more sub-blocks within the designated memory region. Thus, each memory region corresponding to each eight-bit entry in the defect map is thus divided into $2^7$ (128) sub-blocks, and seven bits of each entry are used as an address to point to the specific sub-block within the larger region that contains the defective memory cell. This type of map has the same trade-off between granularity and map size, but it provides an effective way to manage defect maps with much higher granularity.

Another embodiment of a defect map within a DIMM can be implemented when both high granularity and smaller map size are desired, if the number of defective regions is capped at a specific number. In this type of defect map, the size of each entry in the memory defect map is maximized based on the space available for the map and the number of defective regions chosen. For instance, if the SPD has sixty-four bytes (512 bits) available for the defect map and a limit of forty defective regions is chosen, each entry would be 512 bits divided by the forty available entries, resulting in 16 bits per entry. Unlike other examples, no bits are used to flag a region as defective or usable. Instead, all the bits are used as an offset pointer from the lowest memory address on the DIMM. Entries are populated serially as memory defects are found, and each populated entry indicates that the region beginning at the pointer contains a defective memory cell. This type of map has the advantages of increased granularity (resulting in less wasted memory per defect) and small map size, but the memory cannot support more than the chosen number of defective regions. Any additional defects would not be incorporated into the map, and could either be left unmanaged or could be managed by some other method.

An information handling system may include multiple DIMMs. During operation of the information handling system, the memory defect map that is included in the memory storage locations of each of the DIMMs may be combined in the memory of the information handling system into a global memory defect map that identifies the defective memory of the entire information handling system. Thus, during operation of the information handling system, locations of defective memory are known and defective memory locations can be excluded during computing operations. If additional defective memory locations are discovered during operation of the information handling system, these locations are added to the global memory defect map on a real-time basis. If a defective memory location is discovered during operation of the information handling system, a defective memory pointer to the block of defective memory is established in system memory at memory address that is above or higher than the memory space of the DIMMs of the information handling system. Depending on the number of DIMMs in the information handling system, the first one, two, or three bits of the entry are a DIMM index that identifies the DIMM that includes the defective memory block. The remaining bits of the defective memory pointer are a block index that identifies the location of the defective memory block within the affected DIMM. The block index is created by dividing the physical address of the defective memory cell on the DIMM by the defined block size of the defect block that has been established for the DIMMs of the information handling system. In this manner, an index is created, comprising an entry in memory that includes (a) an index to the DIMM that includes a defect and (b) an index to the memory block within the DIMM. After this pointer is created, the pointer is added to the global memory defect map, resulting in the defective memory block being excluded from operations in the information handling system.

Figure 5:
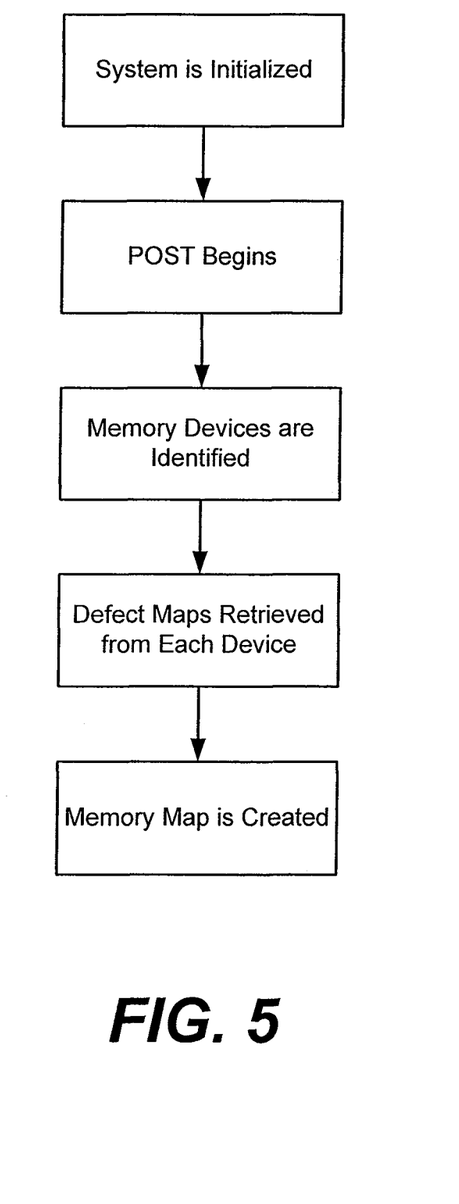
FIG. 5 shows a flow diagram from system initialization to the creation of a usable memory map.

FIG. 5 is a flow diagram of the creation of a usable memory map. After the information handling system is initialized at step 500, the power-on self-test (POST) phase begins at step 510. During POST, memory devices are identified and the defect maps for memory are retrieved from each respective device (step 520). A defect map is a memory map of defective memory locations at step 530. At step 540, a usable memory map is created which excludes the memory locations that are identified in the memory defect map. Thus, even though a memory device includes defective memory, the locations of the defective memory are mapped out of the usable memory map that is created by the operating system.

Although this disclosure has been described with respect to the operation of DIMMs within an information handling system, it should be recognized that the memory system and method described herein may be implemented with any physical storage device that is potentially subject to defects. Consistent with this disclosure, for example, a magnetic storage device may be coupled to other non-volatile storage which contains a defect map for the magnetic storage device.

Although the present disclosure has been described in detail, it should be understood that various changes, substitutions, and alterations can be made hereto without departing from the spirit and the scope of the invention as defined by the appended claims.

What is claimed is:

1. A system for managing memory defects, comprising:
   a first quantity of memory;
   a second quantity of memory;
   a processor communicably coupled to the first quantity of memory and the second quantity of memory, wherein the processor is operable to:
     detect at least two non-contiguous defective portions of the first quantity of memory;
     determine a number of intervening non-defective memory blocks between the at least two non-contiguous defective portions;
     determine if the number of intervening non-defective memory blocks is within a certain range; and
     mark the at least two non-contiguous defective portions of the first quantity of memory and the intervening non-defective memory blocks as a defective memory block, wherein the defective memory block is a defined section of contiguous storage within the first quantity of memory;
   a memory defect map, wherein said memory defect map contains information regarding the defective memory block and is stored in the second quantity of memory, wherein each entry of the memory defect map corresponds to a region of a physical address on the first quantity of memory;
   an information handler, wherein defective portions of the first quantity of memory are hidden from the information handler based, at least in part, on the information stored in the memory defect map; and
   a global memory defect map, wherein the global memory defect map comprises an identification of the memory defect map stored in the second quantity of memory and any other memory defect map stored in any other quantity of memory, and wherein additional defective memory blocks detected during operation of the information handler are added to the global memory defect map in real-time.

2. The system of claim 1, wherein the second quantity of memory is nonvolatile.

3. The system of claim 1, wherein the first and second quantities of memory are physically coupled.

4. The system of claim 1, wherein the first quantity of memory is random access memory.

5. The system of claim 1, wherein the second quantity of memory is read-only memory.

6. The system of claim 1, wherein a portion of the read-only memory is reserved for serial presence detect information.

7. The system of claim 1, wherein the first and second quantities of memory are comprised in a dual inline memory module.

8. A method for managing memory defects, comprising:
   detecting at least two non-contiguous defective portions of a first quantity of memory using a processor coupled to the first quantity of memory;
   determining a number of intervening non-defective memory blocks between the at least two non-contiguous defective portions;
   determining if the number of intervening non-defective memory blocks is within a certain range;
   marking the at least two non-contiguous defective portions of the first quantity of memory and the intervening non-defective memory blocks as a defective memory block, wherein the defective memory block is a defined section of contiguous storage within the first quantity of memory;
   creating a memory defect map, wherein the memory defect map contains information regarding the defective memory block, and wherein each entry of the memory defect map corresponds to a region of a physical address on the first quantity of memory;
   storing the memory defect map in a second quantity of memory coupled to the processor;
   hiding from an information handling system the defective memory block, at least in part, on the information stored in the memory defect map;
   creating a global memory defect map, wherein the global memory defect map comprises an identification of the memory defect map stored in the second quantity of memory and any other memory defect map stored in any other quantity of memory; and
   adding additional defective memory blocks determined during operation of the information handling system to the global memory defect map in real-time.

9. The method of claim 8, wherein the memory defect map is stored in a second quantity of memory.

10. The method of claim 8, wherein the memory defect map and the first quantity of memory are physically coupled.

11. The method of claim 8, wherein the memory defect map is used to hide defective memory from an operating system running on the information handling system.

12. A method for creating a memory defect map, comprising:
   determining the quantity of storage available for a memory defect map in a first quantity of memory, wherein each entry of the memory defect map corresponds to a region of a physical address on the first quantity of memory;
   detecting at least two non-contiguous defective portions of a second quantity of memory;
   determining a number of intervening non-defective memory blocks between the at least two non-contiguous defective portions;
   determining if the number of intervening non-defective memory blocks is within a certain range;
   marking the at least two non-contiguous defective portions and the intervening non-defective memory blocks as a defective memory block, wherein the defective memory block is a defined section of contiguous storage within the first quantity of memory;
   determining a quantity of memory to be mapped by the memory defect map in a second quantity of memory, wherein the determined quantity of memory to be mapped by the memory defect map is based, at least in part, on the defective memory block;

dividing at a processor coupled to the first quantity of memory and the second quantity of memory the quantity of memory to be mapped into a number of regions, wherein the regions are substantially the same size, and wherein the size of the regions corresponds to the quantity of storage available for the memory defect map;

storing, in entries of the memory defect map corresponding to the regions of memory to be mapped, information regarding the presence of defective memory in each respective region of memory;

hiding the defective memory block of the second quantity of memory from an information handler based, at least in part, on the information stored in the memory defect map;

creating a global memory defect map, wherein the global memory defect map comprises an identification of the memory defect map and any other memory defect map stored in any other quantity of memory; and adding additional defective memory blocks detected during operation of the information handler to the global memory defect map in real-time.

13. The method of claim 12, wherein each entry comprises one bit.

14. The method of claim 12, wherein each entry comprises one byte.

15. The method of claim 12, wherein a single bit of each entry indicates the presence of defective memory within the corresponding region of memory.

16. The method of claim 12 further comprising the step of:
Storing, in the available bits of each entry in the memory defect map, address information specifying more particularly the location of the defective memory within the associated memory region.

17. A method for creating a memory defect map, comprising the steps of:
detecting at least two non-contiguous defective portions of a first quantity of memory;
determining a number of intervening non-defective memory blocks between the at least two non-contiguous defective portions;
determining if the number of intervening non-defective memory blocks is within a certain range;
marking the at least two non-contiguous defective portions of the first quantity of memory and the intervening non-defective memory blocks as a defective memory block, wherein the defective memory block is a defined section of contiguous storage within the first quantity of memory;
determining the size of a quantity of memory to be mapped in a first quantity of memory based, at least in part, on the defective memory block;
determining a maximum number of defective regions to be referenced by the memory defect map;
determining a quantity of storage available for the memory defect map in a second quantity of memory, wherein each entry of the memory defect map corresponds to a region of a physical address on the first quantity of memory;
determining at a processor coupled to the first quantity of memory and the second quantity of memory a maximum quantity of storage available for a reference to a defective region by dividing the quantity of storage available for the memory defect map by the maximum number of defective regions to be referenced by the memory defect map;
assigning a defective region a reference, wherein the size of the defective region is based on the maximum quantity of storage available for a reference to a defective region and the size of the quantity of memory to be mapped;
storing the reference in the memory defect map;
hiding from an information handler the defective memory block of the first quantity of memory based, at least in part, on the information stored in the memory defect map;
creating a global memory defect map, wherein the global memory defect map comprises an identification of the memory defect map stored in the second quantity of memory and any other memory defect map stored in any other quantity of memory; and
adding additional defective memory blocks determined during operation of the information handler to the global memory defect map in real-time.

18. A method for reducing the fragmentation of a memory defect map, comprising the steps of:
searching a memory defect map for defective memory blocks within a specified number of memory blocks of each other, wherein the specified number of memory blocks is based, at least in part, on a quantity of storage available for the memory defect map, wherein each entry of the memory defect map corresponds to a region of a physical address on the first quantity of memory;
storing the memory defect map in a first quantity of memory coupled to a processor;
modifying with the processor the memory defect map to designate the defective memory block as defective, wherein the defective memory block is a defined section of contiguous storage within the first quantity of memory;
creating a global memory defect map, wherein the global memory defect map comprises an identification of the memory defect map stored in the first quantity of memory and any other memory defect map stored in any other quantity of memory; and
adding additional defective memory blocks determined during operation of the processor to the global memory defect map in real-time.

19. The method of claim 18, further comprising the step of:
creating a usable method map based on the modified memory defect map.

* * * * *